United States Patent
Lim et al.

(10) Patent No.: US 8,728,571 B2
(45) Date of Patent: May 20, 2014

(54) FABRICATION METHOD FOR FUNCTIONAL SURFACE

(75) Inventors: Hyuneui Lim, Daejeon (KR); Seungmuk Ji, Daejeon (KR); Jun-Hee Lee, Daejeon (KR); Wan-Doo Kim, Daejeon (KR)

(73) Assignee: Korea Institute of Machinery and Materials (KR)

(*) Notice: Subject to any disclaimer, the term of this patent is extended or adjusted under 35 U.S.C. 154(b) by 270 days.

(21) Appl. No.: 12/845,233

(22) Filed: Jul. 28, 2010

(65) Prior Publication Data
US 2011/0028305 A1 Feb. 3, 2011

(30) Foreign Application Priority Data
Jul. 29, 2009 (KR) .................. 10-2009-0069292

(51) Int. Cl.
C23C 16/00 (2006.01)
C23C 16/02 (2006.01)
C23C 16/26 (2006.01)
C23C 16/40 (2006.01)
B05D 5/08 (2006.01)

(52) U.S. Cl.
CPC ......... C23C 16/0227 (2013.01); C23C 16/0245 (2013.01); C23C 16/26 (2013.01); C23C 16/40 (2013.01); B05D 5/08 (2013.01)
USPC ........ 427/164; 427/165; 427/249.7; 427/307; 427/255.15; 427/255.19

(58) Field of Classification Search
USPC .................................. 427/164, 165, 282, 307
See application file for complete search history.

(56) References Cited

U.S. PATENT DOCUMENTS

| 6,013,372 | A * | 1/2000 | Hayakawa et al. ......... 428/411.1 |
| 6,299,981 | B1 * | 10/2001 | Azzopardi et al. ............ 428/429 |
| 6,464,890 | B2 | 10/2002 | Knappenberger et al. |
| 7,851,045 | B2 * | 12/2010 | Gandon et al. ................ 428/141 |
| 8,211,735 | B2 * | 7/2012 | Graham et al. ................. 438/73 |

(Continued)

FOREIGN PATENT DOCUMENTS

| JP | 2004-502625 | 7/2001 |
| JP | 2007-187868 | 7/2007 |
| KR | 10-2009-0081881 | 11/1999 |
| WO | WO 2008123650 A1 * | 10/2008 |

OTHER PUBLICATIONS

Shiu et al. Fabrication of Tunable Superhydrophobic Surfaces by Nanosphere Lithography. Chem. of Mat. vol. 16, No. 4. Feb. 2004.*

(Continued)

*Primary Examiner* — David Turocy
(74) *Attorney, Agent, or Firm* — Cantor Colburn LLP

(57) ABSTRACT

Provided is a fabrication method for a functional surface that has self-cleaning ability and superhydrophilic anti-reflective property, which includes a) arranging a plurality of beads having a sphere shape on a surface of a transparent substrate; b) forming a predetermined inter-bead gap by etching the plurality of beads; c) forming a surface unevenness on the surface of the substrate by etching the substrate using the plurality of the beads having the predetermined gap as an etching mask; d) removing the plurality of the beads from the surface of the substrate; and e) forming a photocatalytic layer or a compound layer having a surface tension of 18 to 28 N/m on the surface of the substrate formed with the surface unevenness.

6 Claims, 13 Drawing Sheets

(56) References Cited

U.S. PATENT DOCUMENTS

| | | | |
|---|---|---|---|
| 8,216,483 B2* | 7/2012 | Lim et al. | 216/41 |
| 2004/0067339 A1* | 4/2004 | Gandon et al. | 428/141 |
| 2007/0184975 A1* | 8/2007 | Yi et al. | 502/343 |
| 2008/0135089 A1* | 6/2008 | Tsakalakos et al. | 136/248 |
| 2008/0199653 A1* | 8/2008 | Kuo et al. | 428/98 |
| 2008/0199659 A1* | 8/2008 | Zhao | 428/161 |
| 2009/0231714 A1* | 9/2009 | Zhao et al. | 359/601 |
| 2010/0326503 A1* | 12/2010 | Wang et al. | 136/255 |

OTHER PUBLICATIONS

Cheung et al. Fabrication of nanopillars by nanosphere lithography. 2006. http://digitalcommons.unl.edu/chemistrycheung/4. Retrieved Oct. 3, 2012.*

Han et al. Controllable two-dimensional photonic crystal pattersn fabricated by nanosphere lithography. J. Vac. Sci. Technol. B. vol. 23, No. 4. Jul./Aug. 2005, 1585-1588.*

Chih-Hung Sun et al., "Broadband month-eye antireflection coatings on silicon," Applied Physics Letters, vol. 92, 2008, pp. 061112-1-0611121-3.

Nicholas C. Linn et al., "Self-assembled biomimetic antireflection coatings," Applied Physics Letters, vol. 91, 2007, pp. 101108-1-110108-3.

Korean Office Action—Korean Application No. 10-2009-0069292 issued by the Korean Intellectual Property Office on Apr. 5, 2011, citing US2008/0199653, US6464890 and KR10-1999-0081881.

Japanese Office Action—Japanese Application No. 2010-168301 issued on May 24, 2011, citing JP2004-502625 and JP2007-187868.

* cited by examiner

US 8,728,571 B2

FABRICATION METHOD FOR FUNCTIONAL SURFACE

CROSS-REFERENCE(S) TO RELATED APPLICATIONS

The present invention claims priority of Korean Patent Application No. 10-2009-0069292, filed on Jul. 29, 2009, which is incorporated herein by reference.

BACKGROUND OF THE INVENTION

1. Field of the Invention

The present invention relates to a fabrication method for a functional surface that has self-cleaning ability and superhydrophilic or super water-repellent anti-reflective property; and, more particularly, to a fabrication method for a functional surface that has anti-reflective property which is less than 5% of a reflectivity of a transparent substrate, self-cleaning ability by which organic contaminants on the substrate surface are decomposed by themselves and superhydrophilic property, and a fabrication method of a functional surface that has anti-reflective property which is less than 5% of a reflectivity of a transparent substrate, super water-repellent property with self-cleaning ability due to its hydrophobic property.

2. Description of Related Art

In recent, studies for engineering utilization inspired from natural nanostructures are actively in progress. Representative examples are a lotus leaf that is super water-repellent and a moth eye that is non-reflective.

In general, the non-reflection is a concept of anti-reflection, and an anti-reflective surface technology is a technology that reduces reflection of light caused by rapid change in refractive index on a surface of an optical device to increase the amount of light transmitting through the optical device.

A representative model of the non-reflection is a moth eye: since the moth eye is formed of well arranged nanostructure and is thus very low in light reflection, the moth is able to protect itself from predators such as birds and is also able to secure sight, which allows easy activity, with less light even at night.

The non-reflective, i.e. anti-reflective surface using this nanostructure is applied to monitor including OLED/LCD, lighting or advertizing including LED, solar cell, glass for industrial or home appliance including instrument panel for vehicle, optical lens for camera and so on, and can reduce glare due to reflection of external light and reduce the amount of light emerged from the inside to thereby provide clear and bright images.

In general, the anti-reflective surface is made by coating chemicals having a refractive index, which is between those of air and substrate, as a thin film using electron beam deposition or ion assisted deposition. Also, it is necessary to deposit different materials of various layers with different refractive indexes if anti-reflection at different wavelengths is required.

However, the anti-reflective surface using nanostructures has an advantage that it shows anti-reflective effect in wide angle of incidence and wavelength range compared to the existing technology using the coated thin film.

The anti-reflective surface using nanostructures is approached in various nanoprocesses. In recent, there has been reported fabrication of a nanostructure on a silicon surface through dry etching using nanosphere lithography and $SF_4$ plasma, and anti-reflection effect thereof (Peng Jiang et al. APL, vol. 92, 061112, 2008). However, in the aforementioned study, silica nanospheres are arranged on silicon in a single layer and an uneven structure is then formed on the silicon surface using plasma, and the product has a problem that it is not transparent.

Further, the same study group reportedly made a mold using silica nanoparticles and reproduced it with polydimethylsiloxane (PDMS) to synthesize a structure of polyethoxylated trimethylolpropane triacrylate (PETPTA) on glass by UV polymerization (Peng Jiang et al. APL, vol. 91, 101108, 2007). However, there are problems that it is difficult to adjust the shape of the structure and durability is weak.

In general, since the surface of vehicle glass or window pane for building has a low angle of contact for water between 20° and 40°, water droplets are attached to and grow on the surface and then flow down in a shape of heterogeneous water curtain upon the rain. This heterogeneous water curtain causes light scattering to disturb driver's sight especially upon the rain or at night in the case of the vehicle glass, and easily contaminates the surface together with dust or yellow dust in the case of the window pane for building. Meanwhile, in a high rise building which is difficult to clean and has a large area, a self-cleanable glass on which organic/inorganic substances are removed by themselves has a significant advantage in maintenance of the building.

In consideration of above description, the present invention aims to provide a fabrication method for a functional surface, which allows large area treatment, easy fabrication in short time and self-cleaning of organic/inorganic contaminants, and has uniform and deterioration-restricted anti-reflective property, and superhydrophilic property or super water-repellent property showing a self-cleaning ability.

SUMMARY OF THE INVENTION

An embodiment of the present invention is directed to providing a fabrication method for a functional surface on a transparent substrate, which allows self-cleaning of organic contaminants on the substrate and has anti-reflective property which is less than 5% of a reflectivity of a transparent substrate and superhydrophilic property or super water-repellent property with self-cleaning ability. To achieve the object of the present invention, the present invention provides a fabrication method for a functional surface which has self-cleaning ability by photolysis and superhydrophilic anti-reflective ability, wherein the method includes the steps of: a) arranging a plurality of beads having a sphere shape on a surface of a transparent substrate; b) forming a predetermined inter-bead gap by etching the plurality of beads; c) forming a surface unevenness on the surface of the substrate by etching the substrate using the plurality of the beads having the predetermined gap as an etching mask; d) removing the plurality of the beads from the surface of the substrate; and e) forming a photocatalytic layer or a compound layer having a surface tension of 18 to 28 N/m on the surface of the substrate formed with the surface unevenness.

Preferably, the method further includes the steps of: f) arranging a plurality of beads having a sphere shape in a single layer on an opposite surface which is opposite to the surface formed with the surface unevenness; g) forming a predetermined inter-bead gap by etching the plurality of beads arranged on the opposite surface; h) forming a surface unevenness on the opposite surface by etching the substrate using the plurality of the beads having the predetermined gap as an etching mask; i) removing the plurality of the beads from the opposite surface; and j) forming a photocatalytic layer or a compound layer having a surface tension of 18 to 28 N/m on the surface of the substrate formed with the surface unevenness.

Preferably, the transparent substrate is made of glass and the bead is made of plastic.

Preferably, the arranged bead satisfies the following relation equation 1, and the inter-bead gap satisfies the following relation equation 2:

$$50\ nm \leq R_{mean} \leq 200\ nm \quad \text{(relation equation 1)}$$

where, $R_{mean}$ is a mean diameter of the bead, $$5\ nm \leq R \leq 100\ nm \quad \text{(relation equation 2)}$$

where, R is the inter-bead gap.

Preferably, the surface unevenness formed by the etching of the substrate satisfies the following relation equation 3:

$$50\ nm \leq D \leq 1500\ nm \quad \text{(relation equation 3)}$$

where, D is a height difference of the surface unevenness.

Preferably, the etching of the bead and the etching of the substrate are implemented by directional dry etching using an etching gas, respectively, and the bead is etched by an etching gas containing $O_2$, $CF_4$, Ar or a mixture thereof and the substrate is etched by an etching gas containing $CF_4$, $SF_6$, HF or a mixture thereof.

More preferably, the etching gas for the substrate further contains $H_2$ in view of selective etching of material.

Preferably, the beads are arranged on the surface of the substrate by one or more manner selected from the group consisting of spin coating, dip coating, lifting up, electrophoretic deposition, chemical or electrochemical deposition and electrospray.

Preferably, the photocatalytic layer is made of $TiO_2$, ZnO, $WO_3$ $SnO_2$, $BiO_3$ or a mixture thereof, and the photocatalytic layer is deposited by one or more manner selected from the group consisting of Metalorganic Chemical Vapor Deposition (MOCVD), Plasma Enhanced-Metalorganic Chemical Vapor Deposition (PE-MOCVD), Atomic Layer Deposition (ALD), magnetron sputtering and electrospray.

The compound layer is made of fluorine compound or diamond like carbon (DLC), and the compound layer is preferably deposited by one or more manner selected from the group consisting of Physical Vapor Deposition (PVD), Plasma Enhanced-Chemical Vapor Deposition (PE-CVD), spin coating and spray.

Further, the present invention provides superhydrophilic functional glass, which is fabricated using glass as a substrate by the fabrication method in accordance with the present invention and has a reflectivity of less than 5% by the surface unevenness and self-cleaning ability by photolysis of the photocatalytic layer.

Furthermore, the present invention provides super water-repellent functional glass, which is fabricated using glass as a substrate by the fabrication method in accordance with the present invention and has a reflectivity of less than 5% by the surface unevenness and self-cleaning ability by the compound layer.

In the fabrication method for a functional surface in accordance with the present invention, the substrate surface is anti-reflective by fine unevenness formed on the surface of the transparent substrate, the fine unevenness can be formed uniformly in a short time even when the area of the substrate is large and the substrate surface itself, without attachment of foreign material, anti-reflective so that deterioration of the anti-reflective property according to time is prevented and physical stability is excellent.

Also, in the fabrication method for a functional surface in accordance with the present invention, since the photocatalytic layer is formed on the fine unevenness that gives the anti-reflective property, superhydrophillic ability is obtained and at the same time, self-cleaning ability in which the organic contaminants attached on the substrate are removed by photolysis of the photocatalyst is obtained so that clean surface can be maintained. Also, inorganic contaminants are easily removed by the superhydrophillic ability and distortion or scattered reflection of light due to attachment, coagulation and growth of water is prevented to secure visibility.

Furthermore, in the fabrication method for a functional surface in accordance with the present invention, since the compound layer made of fluorine compound or DLC is formed on the fine unevenness that gives the anti-reflective property, super water-repellent ability is obtained and at the same time, self-cleaning ability is obtained so that clean surface can be maintained. Also, water droplet or contaminants are easily removed by the super water-repellent ability and distortion or scattered reflection of light due to attachment, coagulation and growth of water is prevented to secure visibility.

DETAILED DESCRIPTION OF MAIN ELEMENTS

100: substrate 110, 110': fine unevenness
200, 200': bead
300, 300': photocatalytic layer or compound layer

DESCRIPTION OF SPECIFIC EMBODIMENTS

The advantages, features and aspects of the invention will become apparent from the following description of the embodiments with reference to the accompanying drawings, which is set forth hereinafter.

Unless defined otherwise, all technical and scientific terms used herein have the same meaning as commonly understood by one of ordinary skill in the art to which the present invention belongs. Also, well-known functions or constructions which may unnecessarily obscure the subject matter of the present invention will not be described in detail.

Figure 1:
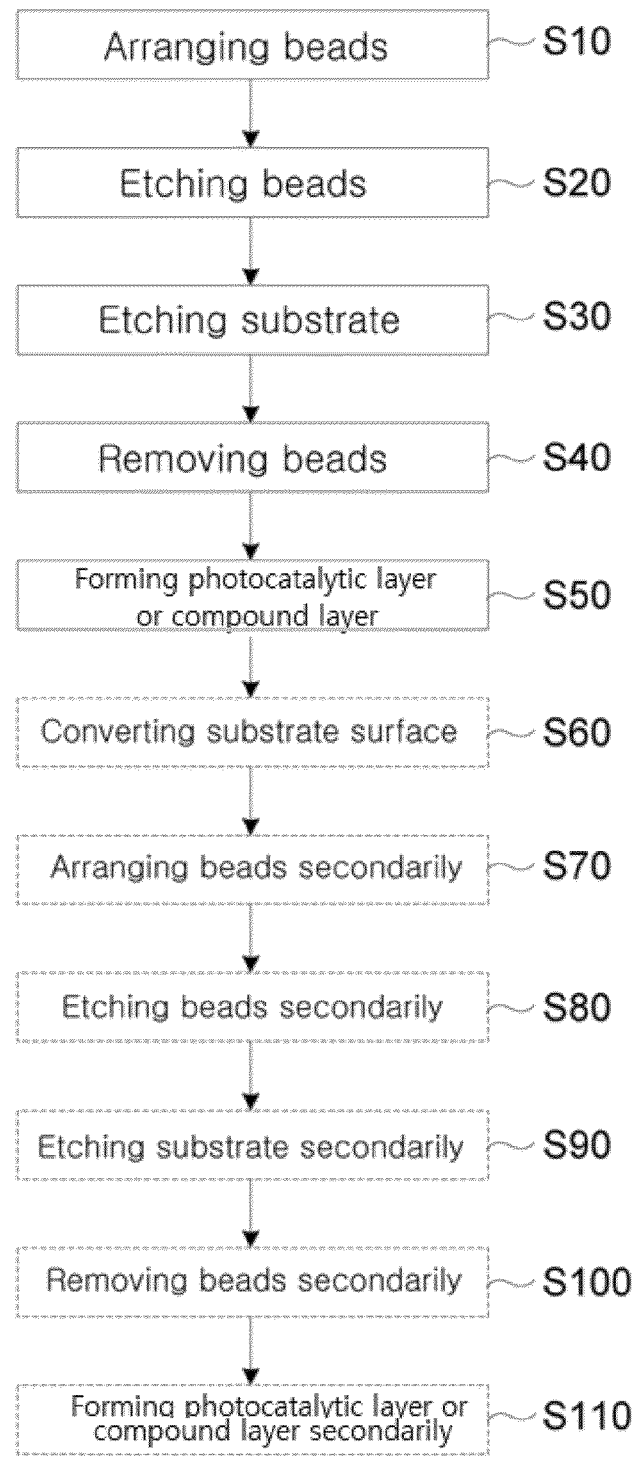
FIG. 1. illustrates process steps of a fabrication method for a functional surface in accordance with the present invention

FIG. 1 illustrates process steps of a fabrication method for a functional surface in accordance with the present invention, wherein the steps surrounded by a dot lined box are optional steps which may be implemented in a preferred embodiment.

As illustrated in FIG. 1, the fabrication method for a functional surface in accordance with the present invention includes arranging beads on a surface of a transparent substrate (s10), forming an inter-bead gap by etching the beads (s20), etching the substrate using the etched beads as an etching mask (s30), removing the beads from the surface of the substrate (s40) and forming a photocatalytic layer or a compound layer on the substrate surface formed with surface unevenness thereon (s50).

The transparent substrate is made of glass. When the transparent substrate is made of glass, the bead is plastic bead and preferably polystyrene bead in view of easy etching of the bead and easy selective etching between the substrate and the bead. Also, it is preferred that the beads have a sphere shape in view of uniform and regular bead arrangement according to the position.

Figure 2:
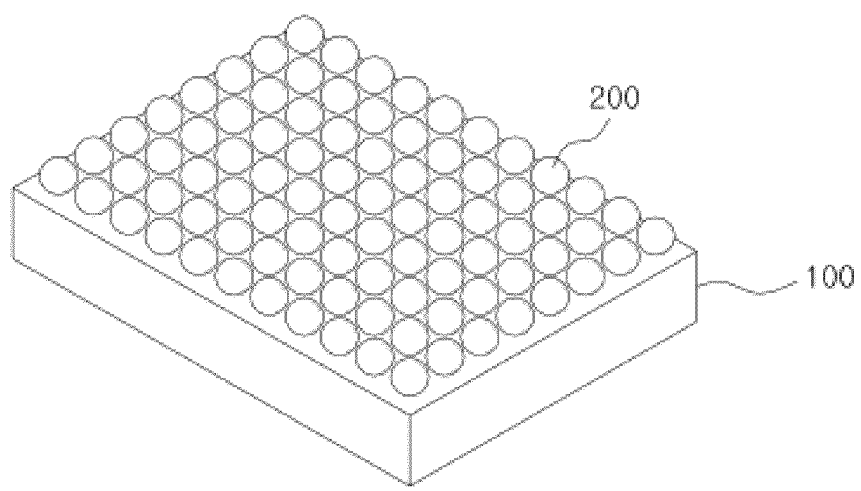
FIG. 2 is a perspective view illustrating arrangement of the beads on a surface of the transparent substrate.

FIG. 2 is a perspective view illustrating the step s10 of arranging the beads on the surface of the transparent substrate. As illustrated in FIG. 2, a plurality of beads 200 having a sphere shape is arranged on the surface of the substrate 100 in a single layer by the step s10. At this time, in the arrangement of the beads, it is preferred that the number of the nearest neighboring beads for each bead is six and it is also preferred that each nearest neighboring bead is adjacent to another. This arrangement of the beads may be adjusted by a content of the bead in a bead dispersion liquid applied or dispersed on the substrate surface, and applying or dispersing condition.

As described above, the step s10 of arranging a plurality of the beads having a sphere shape on the surface of the transparent substrate is implemented by applying or coating the bead dispersion liquid in which the beads are dispersed on the surface of the transparent substrate and then removing the liquid phase of the dispersion liquid, and the applying or coating of the dispersion liquid is implemented by one or more selected from the group consisting of spin coating, dip coating, lifting up, electrophoretic deposition, chemical or electrochemical deposition and electrospray.

At this time, in order to arrange the beads on the surface of the transparent substrate in a single layer with a regular arrangement, it is preferred that the step s10 is implemented by spin coating. In one example, the bead arrangement step s10 of may be implemented by diluting the liquid in which the beads are dispersed at a concentration of 2.5% using methanol including 0.25% of surfactant and then carrying out spin coating for 1 minute at a revolution speed of 3000 rpm.

It is preferred that a step of cleaning the substrate 100 is implemented before the step s10 is implemented. It is preferred that the cleaning employs sulfuric acid piranha-containing solution or organic solvent, and physical vibration.

In one example, a sample of the substrate 100 is dipped in a solution prepared by heating the sulfuric acid piranha-containing solution to 60° C., subject to ultrasonic treatment or agitation for 10 minutes, and cleaned five times with DI water. After that, the cleaned sample of the substrate 100 is dried and then treated for 3 minutes in an UVO cleaner.

FIG. 3(a) is a perspective view illustrating the step s20 of forming a predetermined inter-bead gap R by etching a plurality of the beads 200 arranged on the substrate surface 100 in a single layer, and FIG. 3(b) is an enlarged view of a region 'A' in FIG. 3(a). Herein, the circular dotted line in FIG. 3(b) indicates the diameter of the bead arranged on the substrate surface prior to the bead etching, and the solid line placed within the dotted line indicates the bead 200 with reduced size by etching in the step s20.

Figure 3:
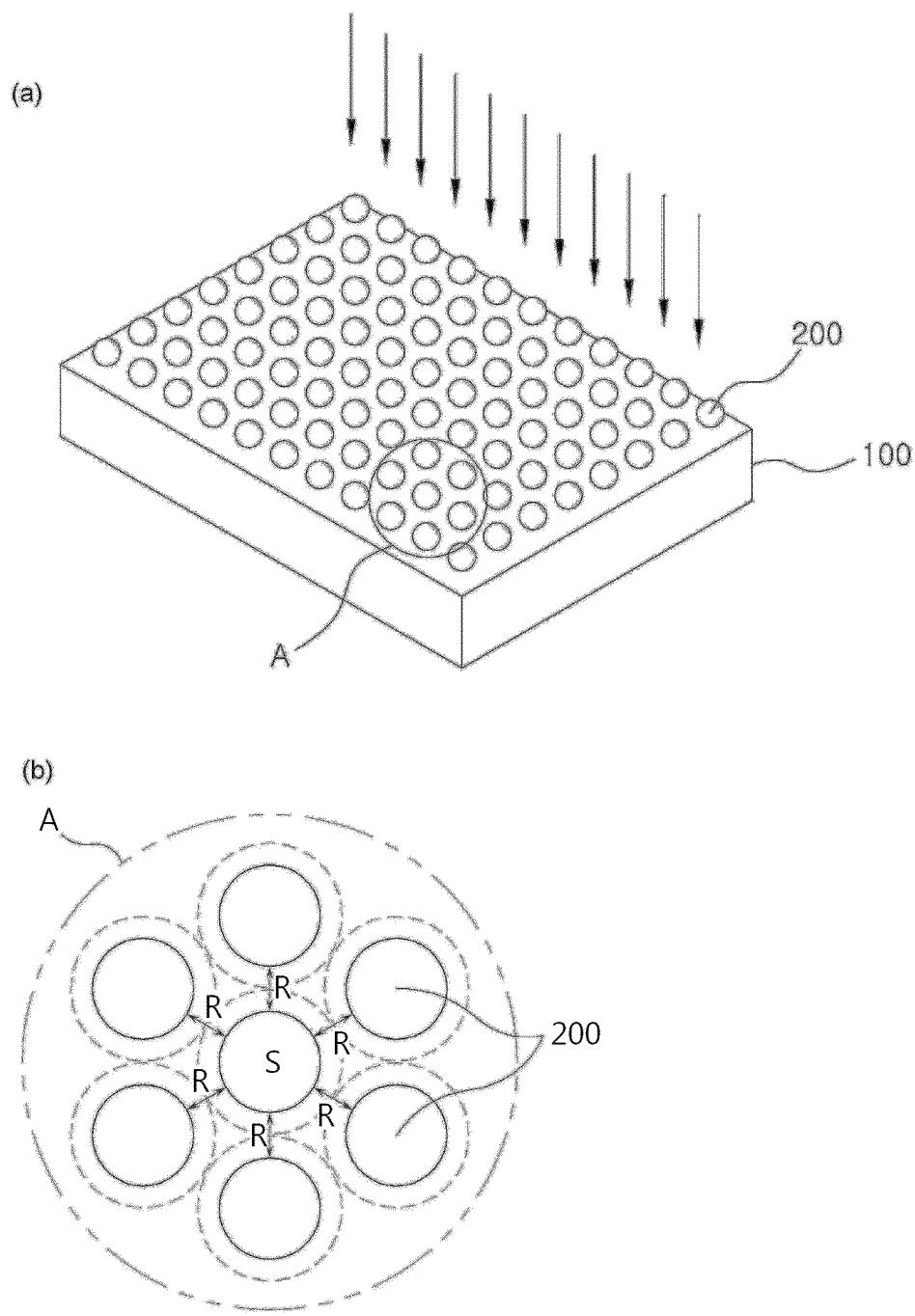
FIG. 3(a) is a perspective view illustrating that the beads in FIG. 2 are etched.
FIG. 3(b) is an enlarged view of a region 'A' in FIG. 3(a).

As illustrated in FIG. 3, the step s20 is a step of forming an etching mask, in which each bead is spaced apart from another with a predetermined gap R, by etching a plurality of the beads 200 arranged on the substrate surface.

At this time, the gap R means, when referring to one bead arbitrarily selected from the plurality of the beads 200 as a standard bead S, the gap between the standard bead S and the neighboring beads adjacently arranged around the standard bead S.

In the step s20, it is preferred that a selective etching in which the substrate 100 is not etched and the beads 200 are selectively etched is implemented, and it is also preferred that a dry etching including plasma etching and ion milling etching is implemented in view of physical stability of the bead arrangement, uniform and controlled gap formation and etching selectivity.

Specifically, the bead is made of plastic material, and the etching of the bead is implemented by directional dry etching using an etching gas containing $O_2$, $CF_4$, Ar or a mixture thereof, and it is preferred for more effective implementation of the selective etching that the etching gas further contains $H_2$.

The etching mask fabricated by the etching of the beads is determined by a surface density of the bead (number of the bead particles/surface area of the substrate), a mean particle size of the bead prior to the etching and an inter-bead gap R, and, in the step s30 of the etching the substrate implemented after the etching of the bead, the substrate surface which is not screened is etched by the etched bead and nanopillar structural body (nanopillar shape by the etched vacant space) which has a shape similar to the pattern of the beads etched on the substrate surface is thus formed.

Therefore, the surface unevenness of the nanopillar structural body is formed by the surface density of the bead, the mean particle size of the bead prior to the etching and the inter-bead gap R.

In order that the transparent substrate has no reduced transparency and anti-reflective property with a reflectivity of less than 5% by this surface unevenness, it is necessary to control the mean particle size of the bead prior to the etching, the inter-bead gap R and etching depth of the substrate, and particularly the mean particle size of the bead prior to the etching, the inter-bead gap R and etching depth of the substrate should be controlled in view of anti-reflective property and prevention of transparency reduction.

In the fabrication method in accordance with the present invention, the mean particle size $R_{mean}$ of the bead prior to the etching and the inter-bead gap R determine dimensions of the region of the substrate not to be etched and the adjacent region of the substrate to be etched; and therefore, in order to have the anti-reflective property in which the wavelength in the range of visible rays is reflected by less than 5%, the mean particle size $R_{mean}$ of the bead prior to the etching satisfies relation equation 1 below and the inter-bead gap R adjusted by the etching of the bead satisfies relation equation 2 below. In addition, the inter-bead gap R allows not only the anti-reflective property but also easy and uniform etching in the step of etching the substrate which will be described later.

50 nm≤$R_{mean}$≤200 nm         (relation equation 1)

5 nm≤R≤100 nm          (relation equation 2)

After forming the etching mask by the etching of the beads (s20), the substrate etching step s30 for the formation of the surface unevenness is implemented. A height difference D of the surface unevenness, which is the etching depth of the substrate, is the factor that has an influence on the anti-reflective property and the substrate transparency and satisfies relation equation 3 below in order to have the anti-reflective property in which the substrate transparency is more than 95% and reflectivity is less than 5%.

50 nm≤D≤1500 nm          (relation equation 3)

Figure 4:
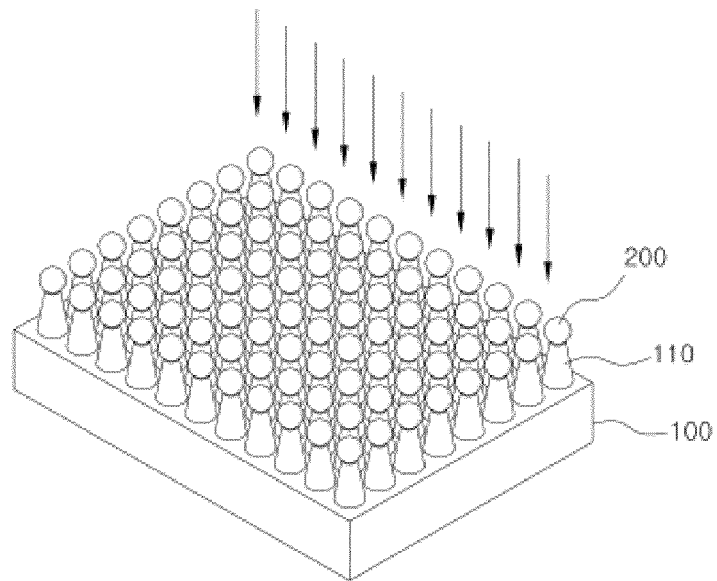
FIG. 4 is a perspective view illustrating that the substrate in FIG. 3(a) is etched.

FIG. 4 is a perspective view illustrating the substrate etching step s30. Referring to FIG. 4, the substrate etching step s30 is the step of etching the surface of the substrate 100 using the plurality of the beads 200 as an etching mask.

Specifically, the step s30 is the step of etching the substrate using the plurality of beads, which have the predetermined gap, as an etching mask, to form a surface unevenness on the surface of the substrate, and is the step in which the substrate surface not screened by the etched beads is etched to transcribe the arrangement of the etched beads 200.

In the step s30, it is preferred that a selective etching in which the beads 200 are not etched and the substrate 100 is selectively etched is implemented, and it is also preferred that a dry etching including plasma etching and ion milling etching is implemented in view of the etching selectivity, orientation of the etching and uniform and controlled etching depth.

Specifically, the substrate is made of glass material, and the etching of the substrate is implemented by directional dry etching using an etching gas containing $CF_4$, $SF_6$, HF or a mixture thereof, and in order to implement the selective etching more effectively upon the etching of the substrate, it is preferred that the etching gas further contains $H_2$.

By the etching of the substrate (s30), fine unevenness 110 of a nanopillar shape is formed on the surface of the substrate 100. AS such, it is possible to form the fine uneven structure on the surface of the substrate 100 by the etching using the dry etching process.

Figure 5:
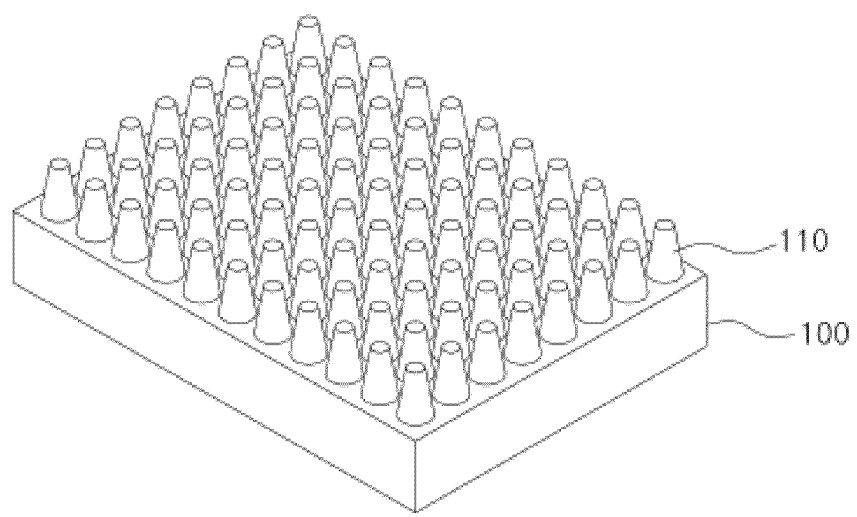
FIG. 5 is a perspective view illustrating that the beads are removed from the surface of the substrate in FIG. 4.

After the etching of the substrate (s30) is implemented, the beads are removed (s40), and FIG. 5 is a perspective view illustrating the bead removing step. Referring to FIG. 5, the fine unevenness 110 alone remains on the surface of the substrate 100 from which the beads 200 are removed.

In order to remove the beads 200, it is preferred to employ ashing process which is widely used in semiconductor process.

More specifically, an $O_2$ plasma ashing process may be applied, and piranha solution, organic solvent, diluted HF solution and steam or ultrasonic cleaning may be used.

Figure 13:
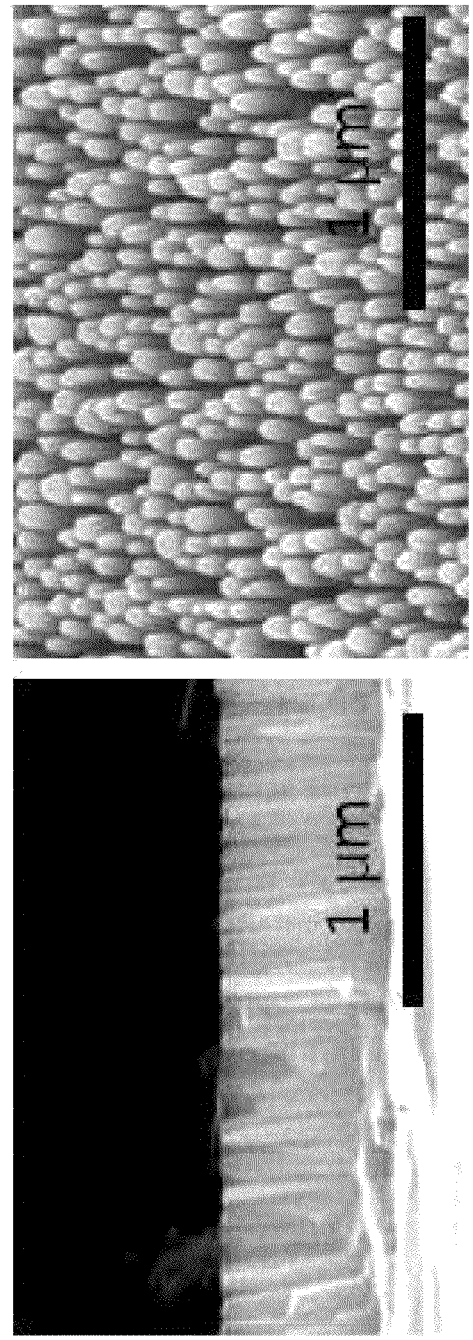
FIG. 13 is a photograph by Scanning Electron Microscope (SEM) showing the surface of the substrate formed with the surface unevenness by the fabrication method for a functional surface in accordance with the present invention.
Figure 14:
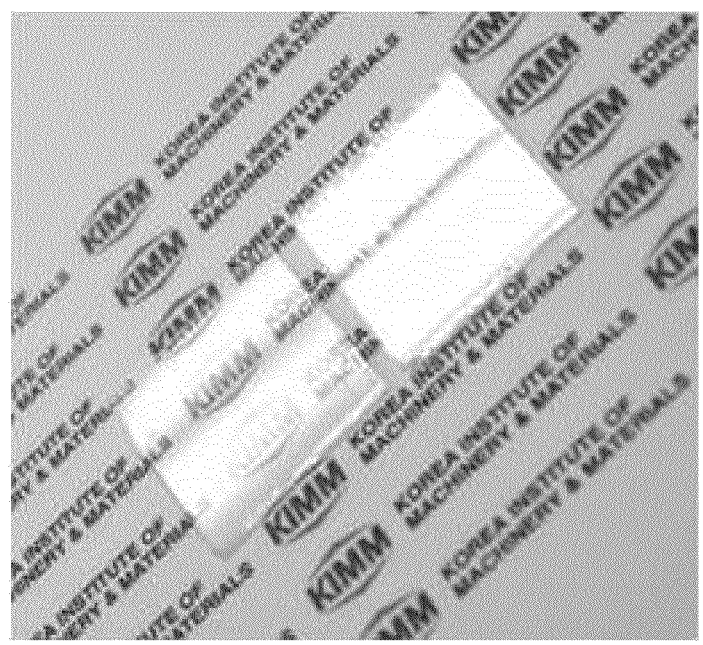
FIG. 14 is an optical photograph of a functional glass fabricated using a glass pane as a transparent substrate by the fabrication method for a functional surface in accordance with the present invention.

FIG. 13 is a photograph by Scanning Electron Microscope (SEM) showing surface unevenness formed through the steps s10 to s40 using the plate glass as a substrate, and FIG. 14 is a view illustrating reflectivity of the plate glass measured before/after formation of the surface unevenness.

Therefore, by forming the fine unevenness 110 on the surface of the substrate 100 through the arrangement of the beads (s10), the etching of the beads (s20), the etching of the substrate (s30) and the removing of the bead (s40) as described above, it is possible to fabricate the transparent substrate 100 having no transparency reduction and the anti-reflective property in which the reflectivity is less than 5%.

Figure 6:
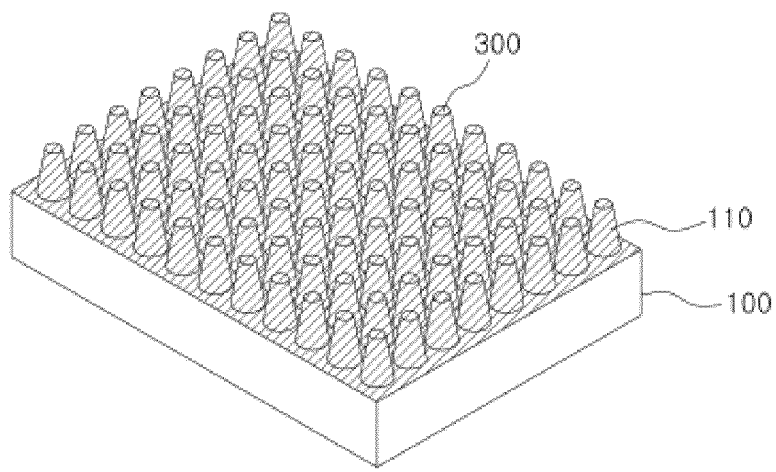
FIG. 6 is a perspective view illustrating that a photocatalytic layer is formed on the surface of the substrate in FIG. 5.

FIG. 6 is a perspective view illustrating the step s50 of forming the photocatalytic layer or the compound layer 300 on the surface of the substrate 100 formed with the surface unevenness.

In the case that the catalytic layer 300 is formed on the surface of the substrate 100 formed with the surface unevenness, when the substrate 100 is made of a glass material A, the substrate 100 shows hydrophilic property, which is the property of easily coupling with water molecules, due to the intrinsic property of the glass material even though it is formed with the fine unevenness 100 on the surface thereof, but the transparent substrate comes to have the superhydrophilic property, in which the angle of contact for water droplet is less than 10°, by the step s50 of forming the photocatalytic layer 300 and maintains visibility of the transparent substrate as the attachment and growth of the water droplet is restricted.

On the substrate surface having the superhydrophilic property by the formation of the photocatalytic layer 300, not only inorganic impurities such as dust attached to the surface of the transparent substrate are easily removed as the water becomes the water curtain, but also the organic contaminants attached to the substrate surface are removed through photolysis. By the photocatalytic layer 300, the substrate surface has a self-cleaning property in which the organic/inorganic contaminants on the substrate surface are removed by themselves.

The photocatalytic layer 300 is preferably a semiconductor photocatalyst and more preferably $TiO_2$, ZnO, $WO_3$ $SnO_2$, $Bi_2O_3$ or a mixture thereof.

The photocatalytic layer 300 may be formed using Spray Pyrolysis Deposition (SPD) or physical/chemical vapor deposition, and in order to form the photocatalytic layer 300 with uniform thickness and high coupling strength on the surface of the substrate 100 formed with the fine surface unevenness 110, the photocatalytic layer 300 is preferably deposited by one or more selected from the group consisting of Metalorganic Chemical Vapor Deposition (MOCVD), Plasma Enhanced-Metalorganic Chemical Vapor Deposition (PE-MOCVD), Atomic Layer Deposition (ALD), magnetron sputtering and electrospray, and the thickness of the photocatalytic layer 300 is preferably 5 nm to 15 nm.

Therefore, by forming the fine unevenness 110 on the surface of the surface of the substrate through the arrangement of the beads (s10), the etching of the beads (s20), the etching of the substrate (s30) and the removing of the bead (s40), and forming the photocatalytic layer 300 as described above (s50), it is possible to fabricate the superhydrophilic transparent substrate 100 having no transparency reduction, the anti-reflective property and the self-cleaning ability.

In the case that the compound layer 300 is formed on the surface of the substrate 100 formed with the surface unevenness, when the substrate 100 is made of a glass material A, the substrate 100 shows hydrophilic property, which is the property of easily coupling with water molecules, due to the intrinsic property of the glass material, when it is formed with the fine unevenness 110 on the surface thereof, but the transparent substrate comes to have the super water-repellent property, in which the angle of contact for water droplet is more than 150°, by the step s50 of forming the compound layer 300 made of fluorine compound or DLC and maintains visibility of the transparent substrate as the attachment and growth of the water droplet is restricted.

The substrate surface having the super water-repellent property by the formation of the compound layer 300 has the self-cleaning ability in that not only water is not adhered thereto but also contaminants attached to the surface of the transparent substrate are easily removed with the water stream.

The compound layer 300 is preferably made of fluorine compound or DLC, and may be formed by one or more manner selected from the group consisting of Physical Vapor Deposition (PVD), Plasma Enhanced-Chemical Vapor Deposition (PE-CVD), spin coating and spray. It is also preferred that a thickness of the compound layer 300 is 5 nm to 1 um.

Therefore, by forming the fine unevenness 110 on the surface of the surface of the substrate through the arrangement of the beads (s10), the etching of the beads (s20), the etching of the substrate (s30) and the removing of the bead (s40), and forming the compound layer 300 as described above (s50), it is possible to fabricate the super water-repellent transparent substrate 100 having no transparency reduction, the anti-reflective property and the self-cleaning ability.

Although it is possible to accomplish the object of the invention by forming the fine surface unevenness 110 on the surface of the substrate 100 as described above, it is preferred to maximize the transmittance by forming the fine surface unevenness on a surface opposite to the surface formed with the fine surface unevenness 110. Specifically, by forming the fine surface unevenness on both surfaces, it is possible to prevent that the light proceeding the inside of the substrate is not transmitted but reflected again after the light is incident to the substrate.

At this time, it is more preferred to fabricate the super hydrophilic transparent substrate 100 with both surface being anti-reflective and self-cleanable by forming similar photocatalytic layer 300 after forming the fine surface unevenness on a surface (opposite surface) opposite to the surface formed with the fine surface unevenness 110.

Also, it is more preferred to fabricate the super water-repellent transparent substrate 100 with both surface being anti-reflective and self-cleanable by forming similar compound layer 300 after forming the fine surface unevenness on a surface (opposite surface) opposite to the surface formed with the fine surface unevenness 110.

Figure 15:
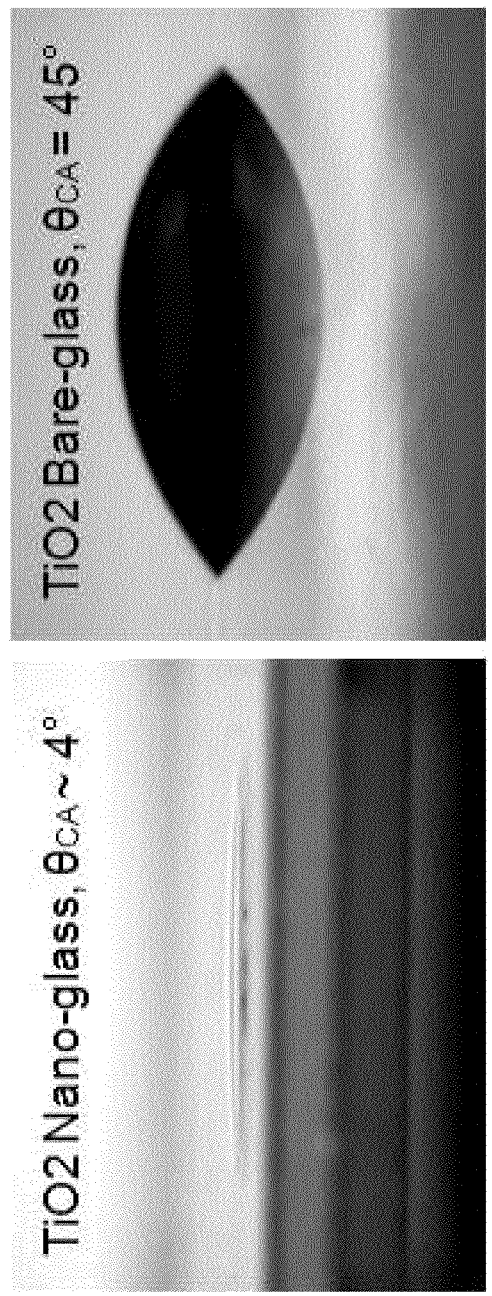
FIG. 15 illustrates measurement (sessile drop method) for the angle of contact for water droplet before and after the formation of the photocatalytic layer 300 in accordance with the present invention.
Figure 16:
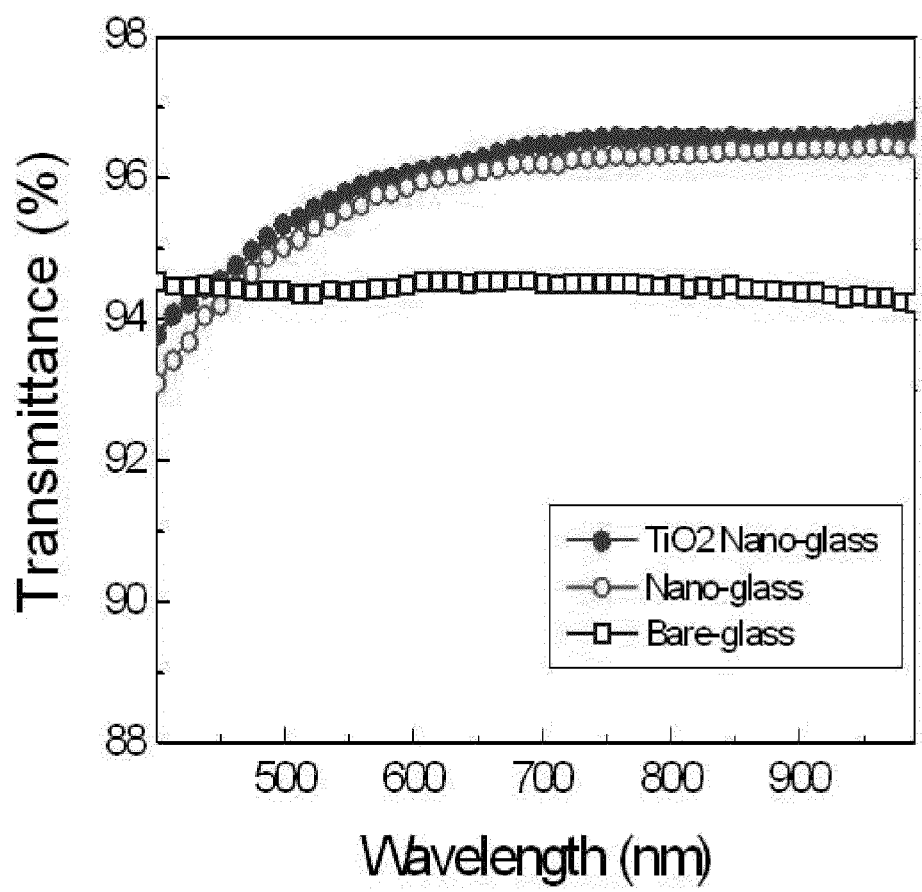
FIG. 16 illustrates measurement for the transmittance of the functional glass in accordance with the present invention.

FIGS. 14 to 16 show the case in that a single surface having a glass pane as the transparent substrate is treated in accordance with the present invention, wherein the sample has the mean particle size $R_{mean}$ of the bead prior to the etching of 80 nm and the inter-bead gap R of 20 nm, is D of a height difference of the surface unevenness of 600 nm and is deposited with 10 nm of $TiO_2$, a photocatalytic material.

FIG. 14 is an optical photograph of a functional glass fabricated using a glass pane as a substrate by the fabrication method of the present invention as described above, and FIG. 15 is measurement (sessile drop method) for the angle of contact for water droplet before and after the formation of the photocatalytic layer 300.

As can be appreciated from FIG. 15, when the photocatalytic layer ($TiO_2$) is formed on a glass pane not formed with the surface unevenness, the surface has an angle of contact of 45 degrees due to the properties of the hydrophilic photocatalytic material itself, but when the same photocatalytic layer ($TiO_2$) is formed after the surface unevenness is formed according to the present invention, it can be appreciated that a superhydrophilic surface having an angle of contact of 4 degrees is fabricated.

'bare-glass' in FIG. 16 is a transmittance of the glass pane itself, 'nano-glass' is the case in that the fine surface unevenness alone is formed on the surface of the glass pane by the steps s10 to s50 as described above, and '$TiO_2$ nano-glass' is the case in that both the fine surface unevenness and the photocatalytic layer ($TiO_2$) are formed. As can be seen from FIG. 16, it can be appreciated that the transmittance is notably raised by the photocatalytic layer formed on the fine surface unevenness and the transmittance in the range of visible rays of more than 500 nm is more than 95%.

Figure 17:
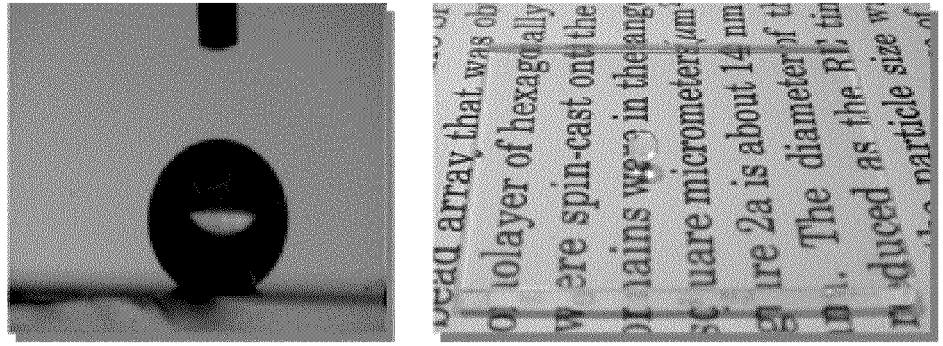
FIG. 17 illustrates measurement (sessile drop method) for the angle of contact for water droplet on of a glass coated with the compound layer 300 in accordance with the present invention, and an optical photograph of a super water-repellent anti-reflective glass on which a water droplet is placed.
Figure 18:
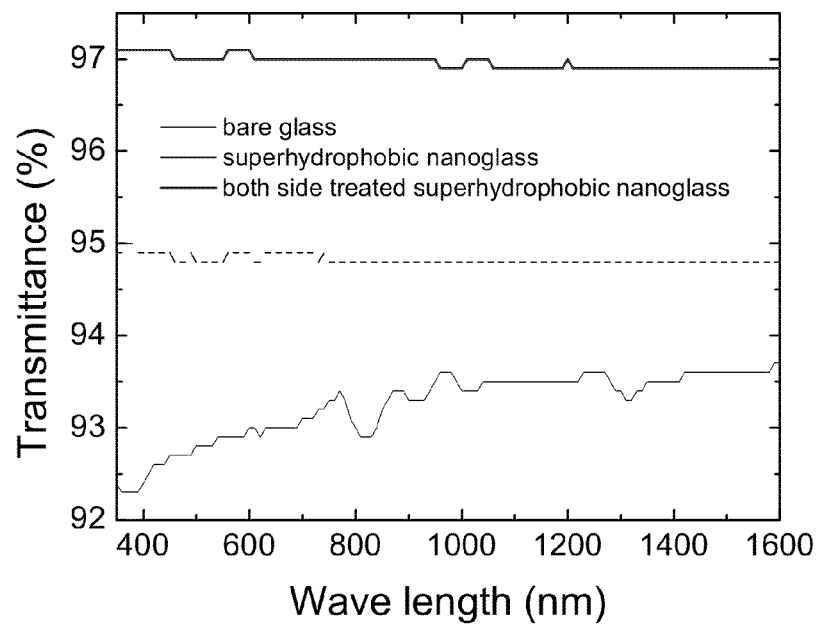
FIG. 18 illustrates measurement of a transmittance of a functional glass formed with super water-repellent anti-reflective functional surfaces in accordance with the present invention on both surfaces thereof using the glass pane as the transparent substrate.

FIG. 17 is measurement (sessile drop method) for the angle of contact for water droplet on of a glass coated with the compound layer 300 in accordance with the present invention, and an optical photograph of a super water-repellent anti-reflective glass on which a water droplet is placed. 'bare-glass' in FIG. 18 is a transmittance of the glass pane itself, 'superhydrophobic nano-glass' is the case in that the fine surface unevenness and the super water-repellent layer are formed on the surface of the glass pane by the steps s10 to s50 as described above using the glass pane as the transparent substrate, and 'both side treated superhydrophobic nano-glass' is the case of measurement of a transmittance of a functional glass formed with super water-repellent anti-reflective functional surfaces in accordance with the present invention on both surfaces thereof by the steps s10 to s110 as described above or will be described later using the glass pane as the transparent substrate.

Hereinafter, the manner of forming an unevenness 110' as well as a photocatalytic layer or a compound layer 300' on the opposite surface of the substrate 100 not formed with the unevenness 110 will be described.

Figure 7:
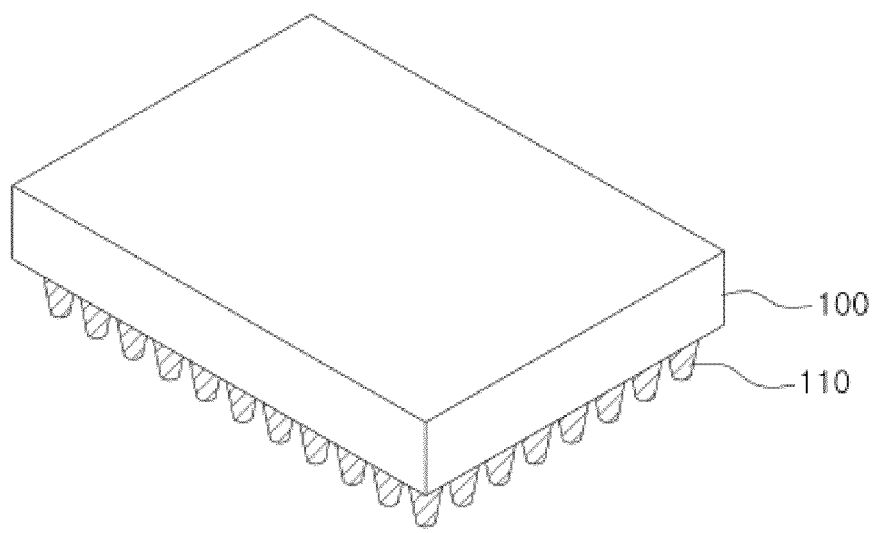
FIG. 7 is a perspective view illustrating that the substrate in FIG. 6 is converted.

FIG. 7 is a perspective view illustrating a step s60 of converting the substrate surface. Referring to FIG. 7, the step s60 of converting the substrate surface is a preparation step of converting the substrate 100 by 180° C. in order to form the unevenness 110' which is the same as the aforementioned unevenness 110 even on the opposite side of the surface of the substrate 100 which is formed with the unevenness 110 through the step s10 of arranging the beads to the step s40 of removing the beads or the step s10 of arranging the beads to the step s50 of forming the photocatalytic layer.

Figure 8:
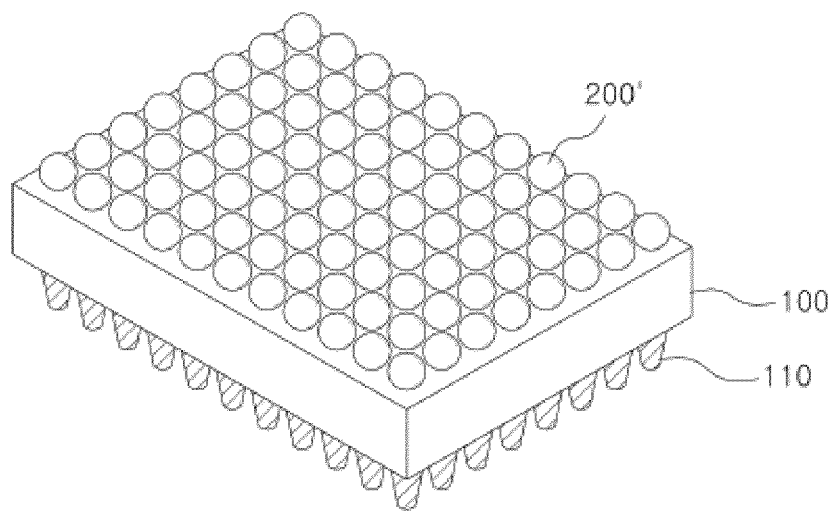
FIG. 8 is a perspective view illustrating that beads are arranged on an opposite surface of the substrate in FIG. 7.

FIG. 8 illustrates a step s70 of secondarily arranging the beads, and is the step of arranging a plurality of beads 200' having a sphere shape in a single layer on the opposite surface of the substrate 100, which is not processed, through the manner similar to the bead arrangement step s10.

Herein, it is preferred to clean the substrate 100 prior the arrangement of the beads 200', and when cleaning the substrate 100 before arranging the beads 200 in the bead arrangement step s10, it is preferred to clean the other surface of the substrate 100 together.

Also, the specific manner of arranging the beads 200' and the properties of the beads 200' in the step s70 of secondarily arranging the beads are similar to those in the step s10 of arranging the beads and thus will not be described.

Figure 9:
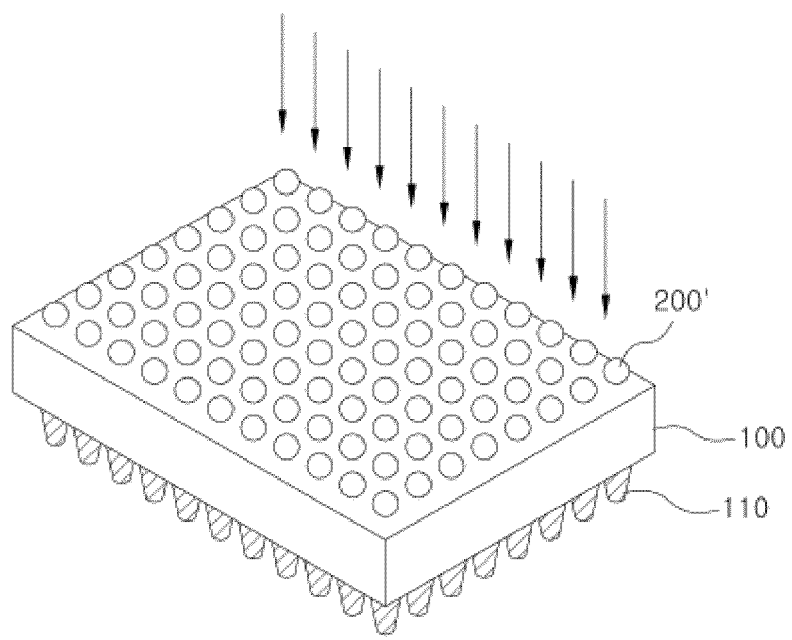
FIG. 9 is a perspective view illustrating that the beads in FIG. 8 are etched.

Next, FIG. 9 is a perspective view illustrating a step s80 of secondarily etching the beads. Referring to FIG. 9, the step s80 of secondarily etching the beads is the step of forming an etching mask with a predetermined gap R between the beads 200' by etching the plurality of the beads 200', and the specific manner and condition for the formation of the etching mask are similar to those in the step s20 of etching the beads and thus will not be described.

Figure 10:
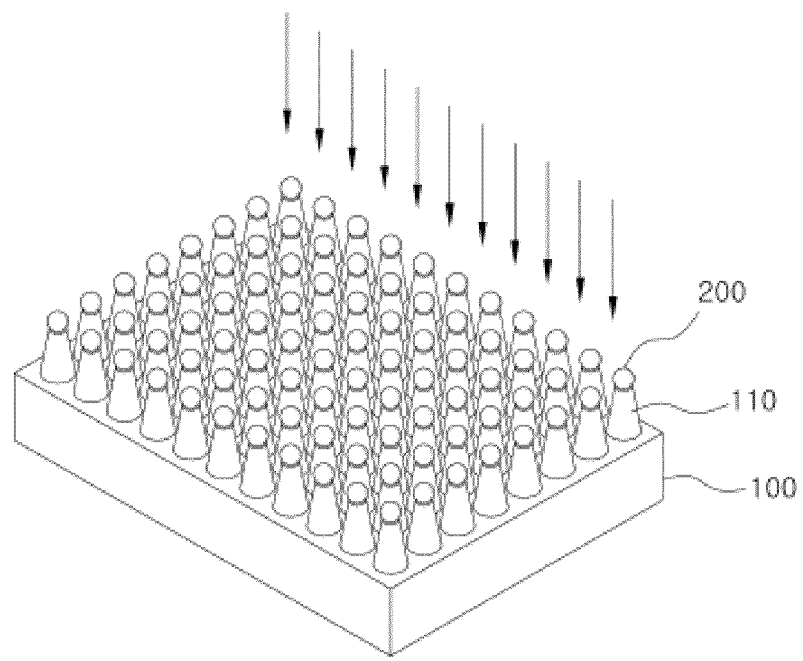
FIG. 10 is a perspective view illustrating that the substrate in FIG. 9 is etched.

FIG. 10 is a perspective view illustrating a step s90 of secondarily etching the substrate. Referring to FIG. 10, the step s90 of secondarily etching the substrate is the step of forming the surface unevenness 110' by etching the opposite surface of the substrate 100 using the plurality of the beads 200' as an etching mask, and the specific manner is similar to that in the step s30 of etching the substrate and thus will not be described.

Figure 11:
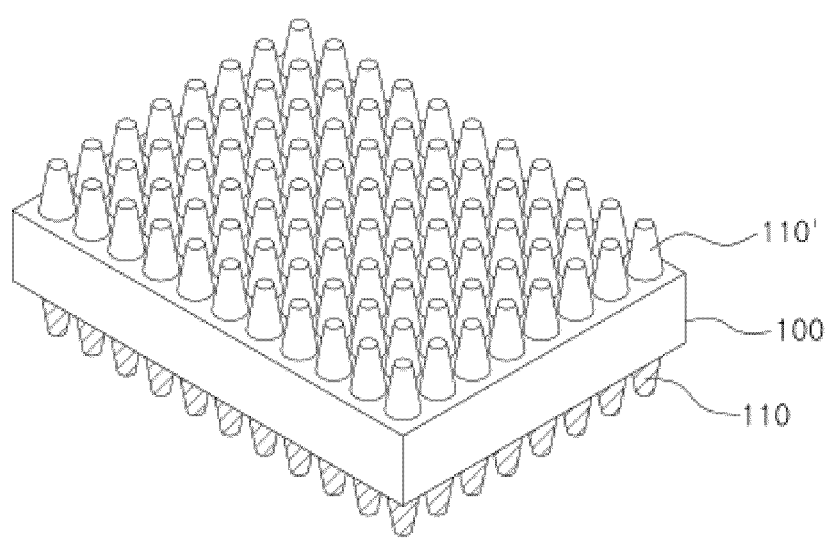
FIG. 11 is a perspective view illustrating that the beads are removed from the opposite surface of the substrate in FIG. 10.

FIG. 11 is a perspective view illustrating a step s100 of secondarily removing the beads. Referring to FIG. 11, the step s100 of secondarily removing the beads is the step of removing the plurality of beads 200' from the opposite surface of the etched substrate 100. The specific manner of removing the beads 200' is similar to that in the step s40 of removing the beads and thus will not be described.

Figure 12:
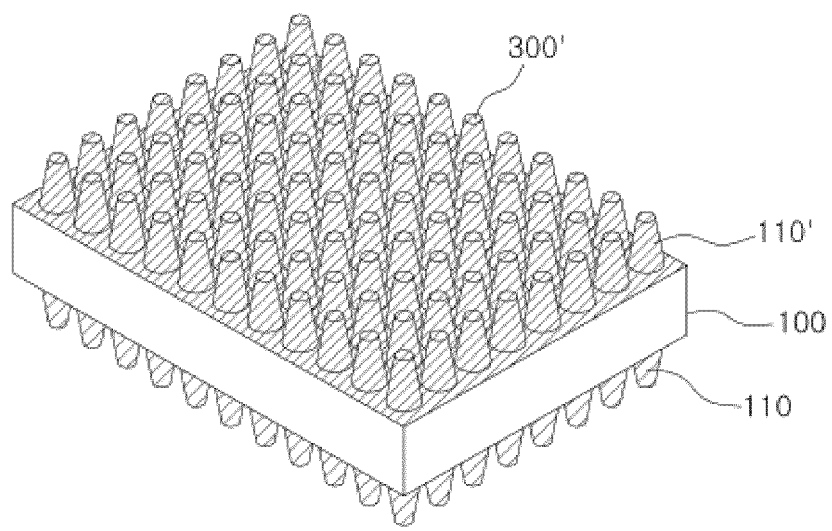
FIG. 12 is a perspective view illustrating that a photocatalytic layer is formed on the opposite surface of the substrate in FIG. 11.

Next, FIG. 12 is a perspective view illustrating a step s110 of secondarily forming a catalytic layer or a compound layer. Referring to FIG. 12, the step s110 of secondarily forming a catalytic layer or a compound layer is the step of forming the photocatalytic layer or a compound layer on the opposite surface formed with the surface unevenness 110', and the manner of coating the photocatalytic layer or a compound layer 300' on the substrate 100 is similar to that in the step s50 of forming the photocatalytic layer or a compound layer and thus will not be described.

Through the fabrication method for a functional surface, using glass as a substrate, in accordance with the present invention as described above, it is possible to fabricate functional glass, and the functional glass has a reflectivity of less than 5% by the surface unevenness and is a superhydrophilic glass having self-cleaning ability by the photolysis of the photocatalytic layer, and more particularly, it is a superhydrophilic glass having an angle of contact of less than 10° by the surface unevenness and the photocatalytic layer.

More particularly, the glass has a reflectivity of less than 1% as the surface unevenness is formed on both opposite surfaces of the glass, and is a superhydrophilic glass having self-cleaning ability by the photolysis of the photocatalytic layer.

Like the superhydrophilic glass, through the fabrication method for a functional surface, using glass as a substrate, in accordance with the present invention as described above, it is possible to fabricate functional glass, and the functional glass has a reflectivity of less than 5% by the surface unevenness and is a super water-repellent glass having self-cleaning ability of the compound layer, and more particularly, it is a super water-repellent glass having an angle of contact of more than 150° by the surface unevenness and the compound layer.

More particularly, the glass has a reflectivity of less than 1% as the surface unevenness is formed on both opposite surfaces of the glass, and is a super water-repellent glass having self-cleaning ability of the compound layer.

While the present invention has been described with respect to the specific embodiments, it will be apparent to those skilled in the art that various changes and modifications may be made without departing from the spirit and scope of the invention as defined in the following claims.

What is claimed is:

1. A fabrication method for a functional surface which has transparency and anti-reflectivity with self-cleaning ability by photolysis, comprising:
   a) arranging a plurality of first beads having a sphere shape on a first surface of a transparent substrate, the arranged first beads having a first average particle size Rmean;
   b) etching the arranged first beads to form first etched beads having a first pre-determined inter-bead gap R between the first etched beads;
   c) etching the substrate using the first etched beads having the first predetermined inter-bead gap R as an etching mask to form a first surface unevenness on the first surface of the substrate;
   d) removing the first etched beads from the first surface of the substrate;
   e) forming a photocatalytic layer on the first surface of the substrate formed with the first surface unevenness so that the first surface of the substrate formed with the first surface unevenness has superhydrophilic ability;
   f) arranging a plurality of second beads having a sphere shape in a single layer on a second surface which is opposite to the first surface formed with the first surface unevenness, the arranged second beads having a second average particle size Rmean;
   g) etching the arranged second beads arranged on the second surface to form second etched beads having a second pre-determined inter-bead gap R between the second etched beads;
   h) etching the substrate using the second etched beads having the second predetermined gap R as an etching mask to form a second surface unevenness on the second surface of the substrate;
   i) removing the second etched beads from the second surface; and
   j) forming a compound layer having a surface tension of 18 to 28 N/m on the second surface of the substrate formed with the second surface unevenness, wherein the compound layer is made of diamond like carbon (DLC),
   wherein the first or second predetermined inter-bead gap R is adjusted by the etching of the arranged first or second beads in such a way that the first or second surface of the substrate formed with the first or second surface unevenness has the anti-reflective property.

2. The method of claim 1, wherein the transparent substrate is made of glass and the first or second bead is made of plastic.

3. The method of claim 1, wherein the first or second average particle size of the arranged first or second beads satisfies the following relation equation 1, and the first or second inter-bead gap R of the first or second etched beads satisfies the following relation equation 2:

$$50 \text{ nm} \le \text{Rmean} \le 200 \text{ nm} \qquad \text{(relation equation 1)}$$

$$5 \text{ nm} \le R \le 100 \text{ nm}. \qquad \text{(relation equation 2)}$$

4. The method of claim 1, wherein the first or second surface unevenness formed by the etching of the substrate satisfies the following relation equation 3:

$$50 \text{ nm} \le D \le 1500 \text{ nm} \qquad \text{(relation equation 3)}$$

Where D is a height difference of the first or second surface unevenness.

5. The method of claim 1, wherein the photocatalytic layer is made of $TiO_2$, $ZnO$, $WO_3$, $SnO_2$, $Bi_2O_3$ or a mixture thereof.

6. The method of claim 5, wherein the photocatalytic layer is deposited by one or more manner selected from the group consisting of Metalorganic Chemical Vapor Deposition (MOCVD), Plasma Enhanced-Metalorganic Chemical Vapor Deposition (PE-MOCVD), Atomic Layer Deposition (ALD), magnetron sputtering and electro spray.

* * * * *